US010254988B2

(12) United States Patent
Balasubramonian et al.

(10) Patent No.: US 10,254,988 B2
(45) Date of Patent: Apr. 9, 2019

(54) MEMORY DEVICE WRITE BASED ON MAPPING

(71) Applicant: Hewlett Packard Enterprise Development LP, Houston, TX (US)

(72) Inventors: Rajeev Balasubramonian, Palo Alto, CA (US); Gregg B. Lesartre, Fort Collins, CO (US); Robert Schreiber, Palo Alto, CA (US); Jishen Zhao, San Jose, CA (US); Naveen Muralimanohar, Santa Clara, CA (US); Paolo Faraboschi, Palo Alto, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 0 days.

(21) Appl. No.: 15/500,754

(22) PCT Filed: Mar. 12, 2015

(86) PCT No.: PCT/US2015/020192
§ 371 (c)(1),
(2) Date: Jan. 31, 2017

(87) PCT Pub. No.: WO2016/144362
PCT Pub. Date: Sep. 15, 2016

(65) Prior Publication Data
US 2017/0220257 A1  Aug. 3, 2017

(51) Int. Cl.
G06F 3/06 (2006.01)
G06F 11/10 (2006.01)
(Continued)

(52) U.S. Cl.
CPC .............. *G06F 3/064* (2013.01); *G06F 3/061* (2013.01); *G06F 3/0659* (2013.01);
(Continued)

(58) Field of Classification Search
CPC combination set(s) only.
See application file for complete search history.

(56) References Cited

U.S. PATENT DOCUMENTS 8,612,676 B2  12/2013  Dahlen et al.
8,830,716 B2   9/2014  Feekes
(Continued)

OTHER PUBLICATIONS

International Searching Authority, The International Search Report and the Witten Opinion, PCT/US2015/020192, dated Dec. 10, 2015, 12 Pages.
(Continued)

*Primary Examiner* — Eric Cardwell
(74) *Attorney, Agent, or Firm* — Hewlett Packard Enterprise Patent Department

(57) ABSTRACT

Techniques for memory device writes based on mapping are provided. In one aspect, a block of data to be written to a line in a rank of memory may be received. The rank of memory may comprise multiple memory devices. The block of data may be written to a number of memory devices determined by the size of the block of data. A memory device mapping for the line may be retrieved. The mapping may determine the order in which the block of data is written to the memory devices within the rank. The block of data may be written to the memory devices based on the mapping.

13 Claims, 10 Drawing Sheets

(51) Int. Cl.
    *G06F 12/02*     (2006.01)
    *G11C 7/10*     (2006.01)
    *G11C 7/22*     (2006.01)
    *G06F 12/14*     (2006.01)

(52) U.S. Cl.
    CPC ........ *G06F 3/0683* (2013.01); *G06F 11/1012* (2013.01); *G06F 12/0223* (2013.01); *G06F 12/1408* (2013.01); *G06F 2212/401* (2013.01); *G11C 7/1006* (2013.01); *G11C 7/22* (2013.01)

(56) References Cited

U.S. PATENT DOCUMENTS

| | | | |
|---|---|---|---|
| 8,922,243 | B2 | 12/2014 | Jayasena et al. |
| 2001/0038642 | A1 | 11/2001 | Alvarez et al. |
| 2011/0310974 | A1 | 12/2011 | Shand |
| 2013/0031324 | A1 | 1/2013 | Lastras-Montano |
| 2014/0181458 | A1* | 6/2014 | Loh ............ G06F 12/1027 711/206 |
| 2014/0279967 | A1 | 9/2014 | Amit et al. |
| 2016/0306567 | A1* | 10/2016 | Yang ............ G06F 3/0613 |

OTHER PUBLICATIONS

Pekhimenko et al~Linearly Compressed Pages: A Low-complexity, Low-Latency Main Memory Compression Framework~MICRO-46~Dec. 2013~13 pages.

Shafiee et al., "MemZip: Exploring Unconventional Benefits from Memory Compression," Proceedings of HPCA, 2014, 4 pages.

Pekhimenko et al., "Base-delta-immediate compression: Practical data compression for on-chip caches," Proceedings of PACT, 2012, pp. 377-388.

* cited by examiner

MEMORY DEVICE WRITE BASED ON MAPPING

BACKGROUND

Electronic devices, such as computers, may include memory. For example, a computer may include static random access memory (SRAM) and dynamic random access memory (DRAM). SRAM and DRAM share the characteristic power must be continuously supplied in order to retain data stored in the memory. If the power is removed, the stored data may be lost. Another type of memory that is becoming more prevalent is non-volatile random access memory (NVRAM). NVRAM may have the characteristic that once data is stored to the NVRAM, the data remains persistent, even if power is no longer supplied to the device.

DETAILED DESCRIPTION

Figure 1:
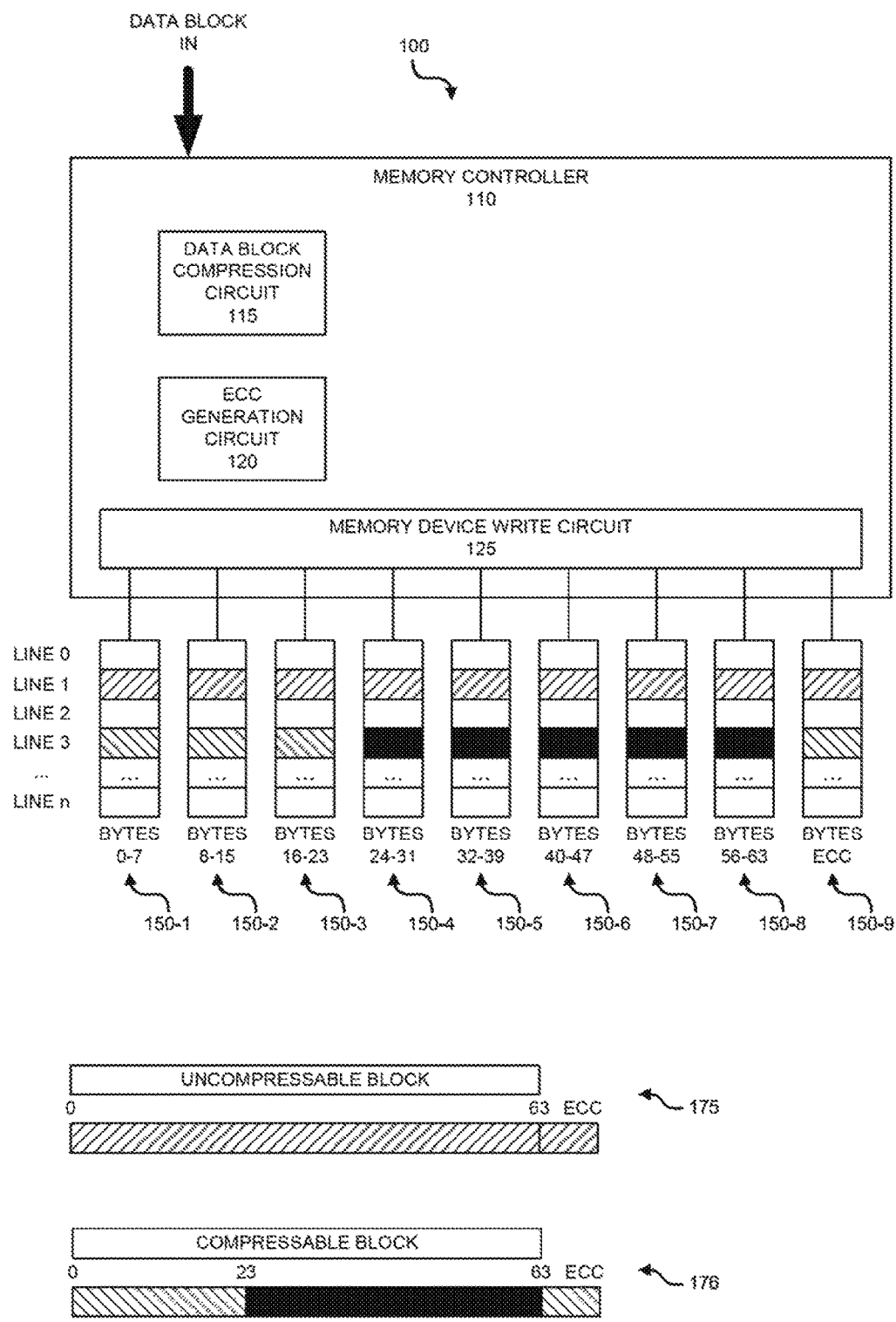
FIG. 1 depicts an example of a device that may use the data writing to a subset of memory devices techniques described herein.

As mentioned above, some memory components in an electronic device, such a SRAM and DRAM require power in order to maintain storage of data. Other devices, such as NVRAM are able to store data without the need to continuously supply power. However, even though power is not needed to retain the persistence of the data, power is needed when the data is originally written. Currently existing forms of NVRAM (e.g. FLASH memory) as well as new types of NVRAM currently being developed (e.g. memristor, phase change RAM, spin torque transfer RAM) do not require the continuous supply of power in order to maintain the persistence of data stored thereon. However, these devices do use power when originally writing the data to the device. This use of power may be referred to as write energy. It should be understood that SRAM and DRAM also require write energy to store data, and as such the techniques described herein are equally applicable to SRAM and DRAM.

Many electronic devices, such as computers, include a memory controller to manage storing and retrieving data from memory. The memory controller may not individually read and write bytes of data from the memory. Rather, the memory controller may operate on groups of bytes, referred to as a line of data. For example, in a computer, memory is typically operated on in units equivalent to the size of a cacheline in the processor. For example, if a processor has a cacheline size of 64 bytes, the memory controller may receive/provide data to the processor in units of 64 bytes. However, techniques described herein are not limited to any particular cacheline size. For the remainder of this description a line may refer to a data block that is provided to the memory controller to be written to memory or is provided by the memory for use by the electronic device. The techniques described herein are not limited to any particular line size.

The memory may be divided across several memory devices which may be referred to as a rank. For example, for a given line, the memory devices that store the data that make up the line are all in the same rank. A rank of memory devices may store multiple lines. For example, for a 64 byte line, there may be 9 memory devices in the rank. Each of the first 8 memory devices (e.g. a memory chip) may store 8 bytes of the line. The $9^{th}$ memory device may be used to store an Error Correction Code (ECC). The nine memory devices that make up the rank may store large numbers of lines. Although a specific example of a rank of memory is described, it should be understood that the techniques described herein are not limited to any particular layout of memory devices in a rank.

The techniques described herein provide for receiving a line of data to be written to memory. The line may be examined to determine if the line can be compressed. If so, the line may be compressed, and a header describing the compression may be added to the line. An ECC for the overall line may be calculated. The compression may result in fewer than the total number of memory devices within the rank being needed to store the compressed line. As such, the memory devices that are not needed are not written, thus saving the write energy that would have otherwise been used to write to those devices. In some cases the data may be encrypted prior to being written to the memory devices.

The line that is stored may contain the data needed to determine if the line is compressed, and if so, how the line should be decompressed. For example, if the ECC does not use all bits available on the ECC storage device for the line, then the extra bits may be used to indicate if the line is compressed or not. In other implementations, different techniques, described below, may be used to determine if the line is compressed. When the data is to be read, it may be determined if the line is encrypted and/or compressed. The line may then be decrypted and/or decompressed and provided to the requestor.

The techniques described herein are Operating System (OS) independent and as such the OS is not required to have any knowledge of the compression occurring in the memory system. In other words the techniques described herein are completely transparent to the OS, applications, or other software running on the system. No OS, application, or other code modification is required.

In one example implementation, writes to the memory devices are based on a mapping. Instead of always writing a compressed block to the rank of memory in the same order, a mapping may be used. For example, if a compressed line would use four memory devices to store the line, the mapping would determine which four devices are used. By using the mapping, it can be ensured that the first memory devices in the rank are not always selected.

Because the writes to memory devices are spread based on the mapping, it may be possible to increase memory write bandwidth by performing multiple writes in parallel. For example, if a first line is to be stored on the first three memory devices and a second line is to be stored on the last three memory devices, the lines may be written in parallel. Because there is no overlap in the memory devices used, each device can be commanded to write a different line. Furthermore, the mapping may even out power dissipation of the memory devices. Using the techniques described herein, power may be dissipated over all the devices in a more even manner, because the mapping ensures that the same set of memory devices are not always used.

FIG. 1 depicts an example of a device that may use the data writing to a subset of memory devices techniques described herein. System 100 may include a memory controller 110 coupled to a plurality of memory devices 150-1 . . . 9. Although 9 memory devices are depicted, it should be understood that this is to aid in the description. The techniques described herein are not limited to any particular number of memory devices.

The memory controller 110 may be a device that is a standalone device, or it may be integrated within a larger device (e.g., a processor, part of a chipset). The techniques described herein are not limited to any particular implementation. The memory controller may include a data block compression circuit 115, an ECC generation circuit 120, and a memory device write circuit 125. The memory controller and each of these circuits may be implemented as hardware circuits, or as a combination of hardware circuits and instructions readable and executable by the hardware circuits. For example, the memory controller may be implemented as logic on an integrated circuit, as an application specific integrated circuit (ASIC), as an FPGA, or in any other suitable manner.

The data block compression circuit may be a circuit to receive a block of data and compress that block of data. For example, the compression circuit may implement Base Delta Immediate (BDI) compression, which may allow a 64 byte data block to be compressed to a data block ranging from 0 to 64 bytes. Although a specific compression technique has been mentioned, the techniques described herein are not limited to any specific compression mechanism.

A block that cannot be compressed may be stored in raw form. A block that can be compressed may have a compression header generated by the compression circuit 115. The compression header may contain information that may be used to later assist in decompression. For example, the compression may indicate the process that was used to compress the data block and how that data block can be decompressed.

The ECC generation circuit 120 may be circuitry used to calculate an ECC for the block of data. The ECC may be used to determine if there has been an error in the data. Many ECCs can be used to correct for single bit errors and detect multiple bit errors. In some implementations, as will be described in further detail below, the ECC may be used to determine if the data block has been compressed. In the example being described, there are 8 bytes provided for an ECC. If the ECC being used does not use all 8 bytes, one or more bits may be used to indicate that the data block is compressed. The ECC generation circuit may insert those bits into the ECC in such implementations. These bits may be referred to as compression metadata. However, if the ECC uses all 8 bytes, an alternate mechanism for determining if the data block is encrypted is described below, with respect to FIG. 3.

The memory device write circuit 125 may be used to write bytes of data to memory devices. For example, the memory device write circuit may be coupled to memory devices that make up a rank of memory. When it is desired to write a line of data to the rank of memory, the memory device write circuit may write the line to the individual memory devices that make up the rank.

The system 100 may also include a plurality of memory devices 150-1 . . . 9 that make up a memory rank. System 100 is shown with a memory rank made up of 9 devices, however, it should be understood that this is for purposes of ease of description and not by way of limitation. The techniques described herein are suitable for use with memory ranks comprising any number of memory devices.

Each memory device may store a particular range of bytes for a given line. For example, memory device 150-1 may store bytes 0-7 for each line, memory device 150-2 may store bytes 8-15, and so on. The rank of memory may store any number of lines, as is shown by lines 1-n. The techniques described herein are not limited to ranks storing any particular number of lines. What should be understood is that a rank of memory may store many lines, and an individual memory device within the rank may store a portion of each line.

In operation, a request to write a block of data may be received by the memory controller. This is depicted by the "DATA BLOCK IN" arrow. At a high level, there are two possibilities when it comes to compressing a block of data. The block is either compressible or it is not compressible. Each of these two situations is now described.

Assume the received block of data 175 is not compressible. As such, the data block compression circuit is not able to compress the data block. As mentioned above, uncompressible data blocks are stored in their raw form. In this case, the block of data is 64 bytes long and may be store uncompressed. The ECC generation circuit may generate an ECC over the 64 bytes and the ECC is appended to the line. The memory device write may then receive the uncompressed data block as well as the appended ECC and write the line to memory devices 150-1 . . . 9. As indicated by the matching hashes, the block of data 175 is show as being written to line 1 within the memory devices. It should be noted that is such cases, each memory device is written to, and as such write energy is used for writing to all 9 memory devices.

In the second case, the received block of data 176 may be compressible. In the example, assume that the compression circuit 115 is able to compress the data block to a smaller number of bytes. The compression circuit may then append a compression header to the compressed bytes. The compression header may be described as metadata that describes the compression. As shown by the hashes on line 176, assume that the compressed data and compression header uses bytes 0-23 (24 bytes total). The ECC may then generate an ECC covering the 24 bytes of compression header and data plus 40 bytes of padding.

The memory device write circuit may then write the compressed line to the memory devices. As shown, memory devices 150-1-3 in line 3 of the memory devices may be used to store the compression header and compressed data. The generated ECC may be stored in memory device 150-9. However, it is not necessary to write any data to memory devices 150-4-8, as indicated by the blacked out boxes. In comparison to the uncompressed case described above, only 4 memory devices instead of 9 are written to. As mentioned above, each write to a memory device requires write energy. By reducing the total number of memory devices written to, compression enables a reduction in the total amount of write energy needed to write a line of data.

In addition to reducing the amount of write energy needed, the techniques described herein also provide for a mechanism to reduce the amount of read energy needed when reading a line of data. This technique is described in further detail below, but what should be understood for now is that the portions of the line not written (e.g. the portions in black) are not use to store valid data. In other words, the portions of each line in black remain unused.

Figure 2:
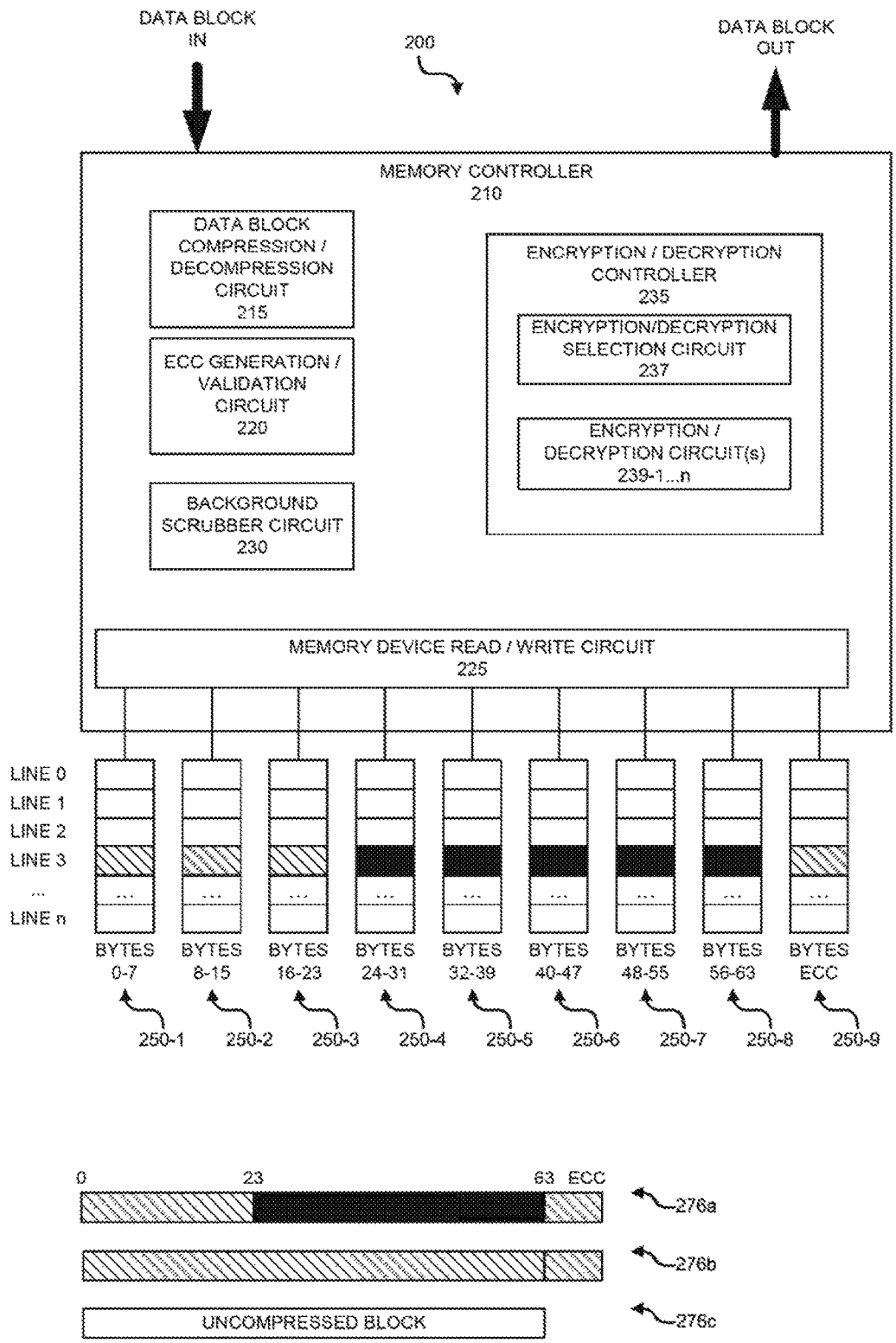
FIG. 2 depicts another example of a device that may use the data writing techniques described herein.

FIG. 2 depicts another example of a device that may use the data writing techniques described herein. Many of the elements of FIG. 2 are very similar to the elements in FIG. 1 and are similarly numbered. For ease of description, the description of those elements is not duplicated. System 200 may include a memory controller 220, which is very similar to memory controller 110. The memory controller may include a data block compression/decompression circuit 215, an ECC generation/validation circuit 220, a memory device write circuit 225, a background scrubber circuit 230, and an encryption/decryption controller 235. System 200 may also include memory devices 250-1 . . . 9, which are essentially the same as those described with respect to FIG. 1.

Data block compression/decompression circuit 215 performs a similar function to the similarly numbered element in FIG. 1. In addition, circuit 215 may also perform decompression. For example, the circuit may use the compression header contained in a compressed line and use that information in order to decompress the compressed line back into the uncompressed block. Although circuit 215 is depicted as a single circuit performing both compression and decompression, it should be understood that this is only an example implementation. Other implementations may use different circuit to perform these functions.

System 200 may also include ECC generation/validation circuit 220. As above with respect to element 120, circuit 220 may generate an ECC to ensure that a line does not contain errors. Circuit 220 may also include functionality to validate the ECC. Circuit 220 may examine a line of data and validate that the ECC indicates that there are no errors in the line. As above, although depicted as a single generate/validate circuit, this is only an example implementation. Other implementations may use different circuits for each of these functions.

System 200 may also include a memory device read/write circuit 225. The memory device read/write circuit may be very similar to the equivalent circuit in FIG. 1, with the exception that the memory devices can be both read and written. The description is not repeated here. System 200 may also include a background scrubber circuit 230. The background scrubber circuit may examine the memory devices 250-1 . . . 9 as a task that runs continuously in the background, setting unused portions of lines to a high resistance state. As mentioned above, some portions of lines may remain unused (e.g. the black boxes). For some memory technologies (e.g. memristor), the amount of read energy used is dependent on the values stored at the designated location, and in the same array. Reads and writes to arrays with more high resistance values may require less energy to perform the read or write. For memory devices storing unused portions of the line, setting the resistance value to a high state reduces the amount of energy needed when reading or writing the line.

Although additional write energy is used when setting the memory devices to the high resistance states, this energy can be expended at a time that is convenient for the system. For example, assume that over a period of time there are a large number of memory writes. During such periods, reducing the overall amount of write energy would be useful, as reduction of energy usage in a system may be helpful. For example, reduction in energy usage may allow the system to remain below power usage caps. Thus, omitting the writes to unused devices would be helpful in ensuring the system stays within operating parameters (e.g. total energy usage). However, at a later time, there may not be many writes occurring. During these periods of time, the background scrubber circuit may operate. If the system load increases such that the background scrubber's energy usage becomes problematic, the system can temporarily halt the background scrubber circuit.

System 200 may also include an encryption/decryption controller 235. The encryption decryption controller may include an encryption/decryption selection circuit 237 and at least one encryption/decryption circuit 239-1 . . . n. The encryption/decryption controller may be used to encrypt and decrypt lines that are stored to the memory devices. The encryption may help improve security in the system. For example, as mentioned above, NVRAM may retain its contents even when power is no longer supplied. A malicious actor could physically steal one or more of storage devices 250-1 . . . 9. The data on these devices could then be retrieved by the malicious actor. By encrypting the data, it may be ensured that even in such a situation, the stolen devices would remain unreadable.

The controller 235 may include an encryption/decryption selection circuit. The encryption/decryption selection circuit 237 may be responsible for dividing up a data block into smaller blocks of a fixed size. In some cases, the smaller blocks may be padded with a value, such as 0. The circuit 237 may be used to divide up the block and pad as needed. Operation of the circuit 237 is described in further detail below, with respect to FIG. 3(a-c).

The controller 235 may also include at least one encryption/decryption circuit 239-1 . . . n. The encryption/decryption circuit 239 may be used to encrypt/decrypt the fixed size blocks of data generated by the circuit 237. In some cases, there may be a single circuit, and blocks are encrypted/decrypted serially. In other implementations, there may be multiple circuits 239, and encryption/decryption of the fixed size blocks may occur in parallel. Furthermore, although shown as a combined encryption/decryption circuit, it should be understood that this functionality may be divided into separate encrypt and decrypt circuits. What should be understood is that system 200 provides circuits to both encrypt and decrypt fixed size blocks of data.

Operation of system 200 will be described with reference to several examples. These examples will generally start with an uncompressed block of data, and will move through the process of compression, encryption, decryption, and decompression. However, every example, will not include every stage.

Continuing with example 176 from FIG. 1, assume that there is a compressed line 276a. The compressed line is also shown as line 3 in memory devices 250-1 . . . 9. In order to read the line, all 9 memory devices 250-1 . . . 9 may be read using the memory device read/write circuit. The data block compression/decompression circuit 215 may examine the compression metadata to determine if the line is compressed. For example, the bits taken from the ECC bytes above may be examined to determine if the block is compressed. If the line is not compressed, the ECC generation/validation circuit 220 may validate the line 276b by determining if the ECC indicates there are any errors. If no errors are present, the uncompressed line 276c may be sent out of the memory controller as indicated by the data block out arrow.

However, if it is determined that the line is compressed, the data block compression/decompression circuit 215 may examine the compression header metadata that was appended to the compressed line to determine how the line was compressed. The line may be padded based on the compression header and the ECC validated. If the line is valid the circuit 215 may decompress the line, resulting in an uncompressed line 276c. The uncompressed data block 276c may be sent as the data block out.

Figure 3A:
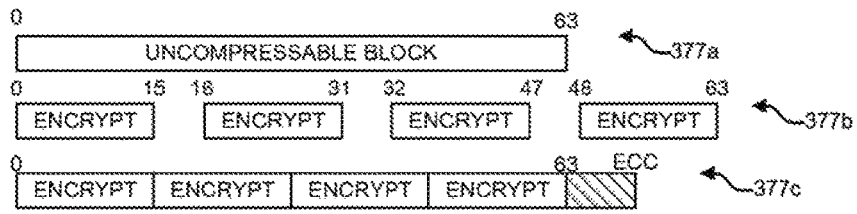
FIGS. 3(a-c) depict examples of write/read patterns in accordance with the data writing techniques described herein.

FIGS. 3(*a-c*) depict examples of write/read patterns in accordance with the data writing techniques described herein. FIGS. 3(*a-c*) continue with the examples that were started in FIGS. 1 and 2. FIG. 3a depicts the encryption process. For example, assume that an uncompressible block of data 377a is received. As should be understood, not all data blocks are able to be compressed. The case of a compressible data block is described further below. The encryption/decryption controller 235 may be used to encrypt the data block.

The encryption/decryption selection circuit 237 may divide the data block 377a into fixed size units. For example, the fixed size units may be 16 bytes each, resulting in the 64 byte data block being divided into 4 fixed size encryption blocks. The encryption/decryption circuit(s) 239-1 . . . n may then encrypt each of the fixed size blocks 377b. As mentioned above, if multiple encryption circuits are provided, the encryption of each block may occur in parallel. However, the techniques described herein are also suitable for use with a single encryption circuit, wherein the blocks are serially encrypted.

The ECC generation/validation circuit 220 may then generate an ECC to ensure that the line contains no errors. The ECC may be appended to the line 377c and the line stored in the memory devices. As indicated, because no compression was done, all memory devices are written and there is no saving of write energy. The process of decrypting the line is described in further detail below.

Figure 3B:
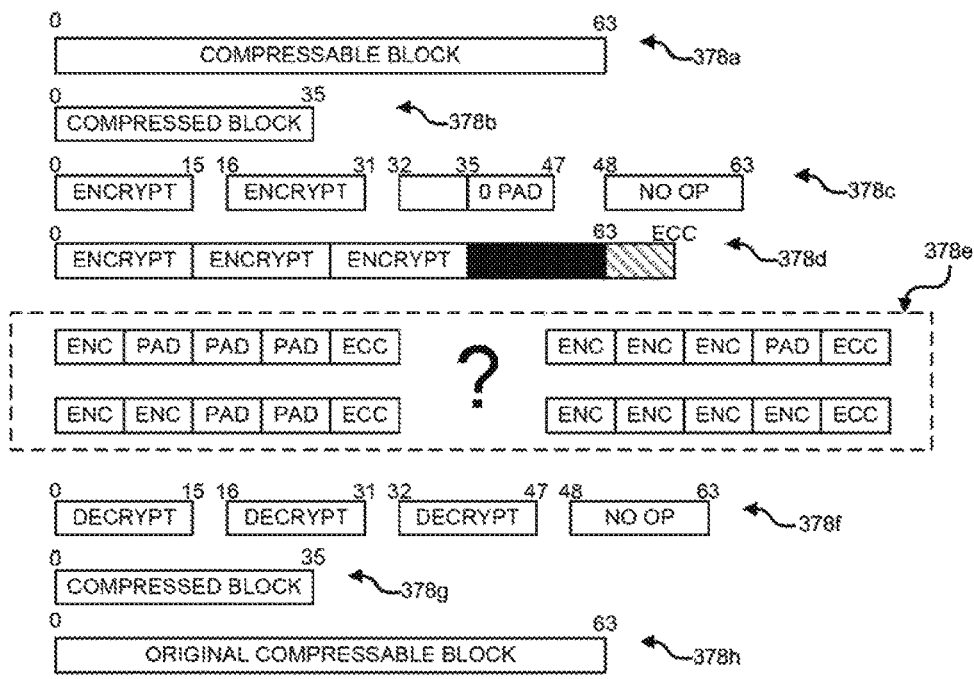

FIG. 3b depicts an example of receiving a compressible block of data, compressing the block, encrypting the block, decrypting the block, decompressing the block, and returning the original compressible block. As shown, a compressible block of data 378a may be received. The data block compression/decompression circuit 215 may be used to compress the data block and append a compression header 378b. In this example, the compressed data block and header is shown as being 36 bytes long.

The encryption/decryption selection circuit 237 may then divide the compressed block into fixed sized encryption units 378c. For example, the fixed size encryption units may be 16 bytes long. As shown, the compressed block may be divided into a first complete encrypt block for bytes 0-15 and a second complete encrypt block for bytes 16-31. The remaining bytes, 32-35 may then be padded (e.g. padded with zeroes) to result in a third encrypt block spanning bytes 32-47. It should be noted that no data is being stored in bytes 48-63. Blocks may then be encrypted by the encryption/decryption circuits 239-1 . . . n. It should be noted that the energy used in the encryption process may be reduced because the total number of blocks to be encrypted has been reduced. For example, unlike the case above with the uncompressible block where 4 blocks were encrypted, here, only 3 blocks are encrypted. Thus the energy used by the encryption blocks may be saved.

The ECC generation/validation circuit 220 may then generate an ECC to protect the line. For example, a 16 byte block of zeroes may be appended to the 3 encrypted blocks. An ECC may be generated and appended to the line 378d. The line may then be written to the memory devices by the memory device read/write circuit 225.

When encryption is performed, the mechanism for decrypting and decompressing the data is slightly different than that which was described above. For example, previously, some spare bits in the ECC bytes may have been used to identify if the block was compressed or not. If it was compressed, the compression header could be examined. However, this examination does not work in cases where the line is encrypted, because the compression header would be unreadable (e.g. it is encrypted). In other words, even if there were bits available in the ECC bytes to indicate the line was encrypted, the compression header could not be deciphered to determine how to decrypt the block. In addition, in some cases, the ECC may use all the available bytes and no spare bits may be available to determine if the line is encrypted.

In the current example, where a line is 64 bytes long, and the encryption block fixed size is 16 bytes, a compressed line may result in either 1, 2, 3 or 4 encrypted blocks. An uncompressed line results in 4 encrypted blocks. As mentioned above, an ECC is generated for the line, padding with zeroes as needed. The ECC generation/validation circuit 220 may attempt to validate the line under each of the four possible scenarios. As shown in 378e, the four possibilities may be 1) one encrypted block, three pad blocks 2) two encrypted blocks, two pad blocks, 3) three encrypted block, one pad block, and 4) four encrypted blocks. With selection of the right ECC it is highly unlikely that more than one of the four possibilities described above would be properly validated by the ECC. Thus, of the four possibilities, the one that is successfully validated determines how many encrypted blocks are present.

After the validation, the encryption/decryption selection circuit 237 may be made aware of how many encrypted blocks are in the line. The selection circuit may then cause the decryption circuits 239-1 . . . n to decrypt the determined number of encrypted blocks. Just as above in the encryption process, because a reduced number of decryptions may need to be performed, the energy used in decrypting may be reduced.

The encrypt/decrypt circuits 239-1 . . . n may then be used to decrypt the number of blocks 378f determined by the selection circuit 237. Once the decryption is complete, the compressed block 378g is recovered. At this point, the compression header is no longer encrypted, and can be retrieved from the compressed block. The data block compression/decompression circuit 215 may then be used to decompress the compressed block back to the original compressible block 378h. This step further confirms the size of the block estimated by the ECC validation circuitry.

Figure 3C:
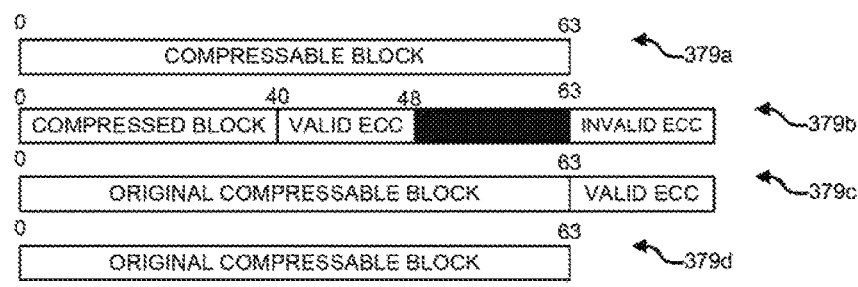

FIG. 3c describes an alternative mechanism to determine if a block has been compressed. As mentioned above, some ECCs may utilize all available space, leaving no bits available to indicate if a block is compressed or not. An alternative mechanism for determining the compression status of a data block may make use of an invalid ECC. Just as above, a compressible block 379a may be received. The compressible block may be compressed. For example, as shown, the compressed block (including compression header) may reside in bytes 0-40. A valid ECC covering those 40 bytes may then be generated and appended to the compressed block.

The valid ECC may be generated by either padding out the compressed block to the size needed by the ECC generation circuit 220. For example, if the ECC generation circuit expects a 64 byte block, then the compressed block can be padded with zeroes. In the alternative, an ECC that does not depend on a specific block size may be generated and data regarding the generation placed in the compression header.

An invalid ECC may then be generated. The invalid ECC may be guaranteed to fail. The compressed block (e.g. bytes 0-40), the valid ECC (e.g. bytes 41-48), unused devices (e.g. bytes 49-63), and the invalid ECC may be stored as a line 379b, in cases where some compression was possible. In cases where no compression is possible, the ECC generated would be the valid ECC to cover the full data block.

When attempting to retrieve the data block, the line containing the data is first read from all memory devices in the rank. The ECC validation circuit 220 attempts to validate the line. If the validation is successful, it means the line was uncompressed, and the data block can be sent out. However, if the ECC validation fails, it may mean that the line is compressed. The compression header may then be examined (perhaps after decryption) to determine how the line was compressed, where the valid ECC is located within the line, and how that ECC was generated 379c. The block may then be decompressed and validated using the valid ECC. The original uncompressed block may then be sent out.

Figure 4:
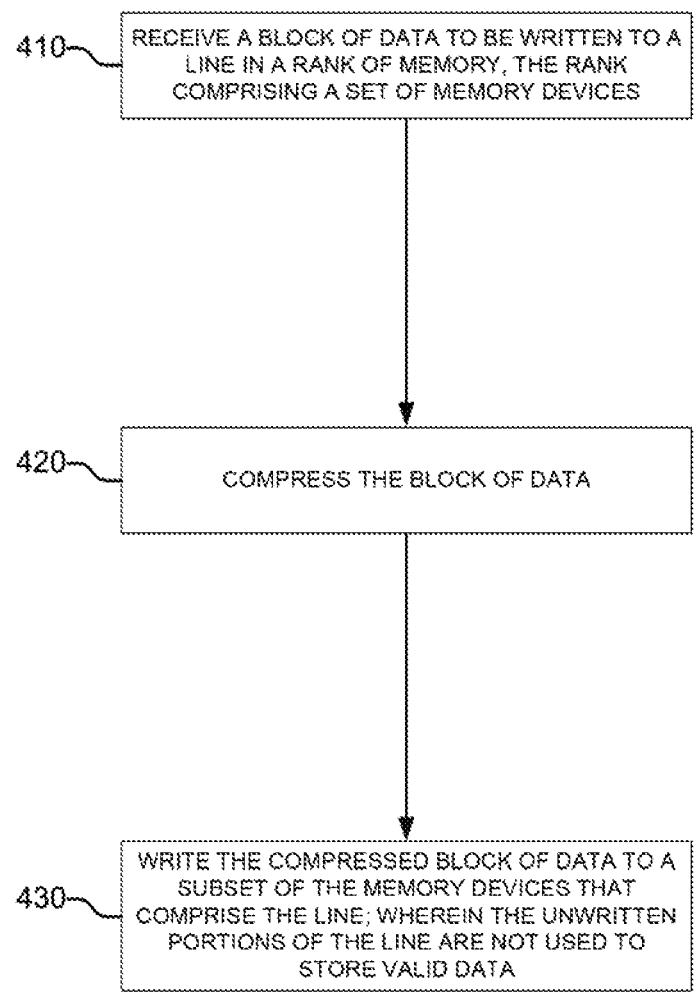
FIG. 4 depicts an example high level flow diagram of the data writing techniques described herein.

FIG. 4 depicts an example high level flow diagram of the data writing techniques described herein. In block 410, a block of data to be written to a line in a rank of memory may be received. The rank of memory may comprise a set of memory devices. As described above, the rank may be made up of any number of memory devices. The techniques described herein are not limited to a specific number of memory devices within a rank.

In block 420, the block of data may be compressed. As explained above, one possible compression mechanism is BDI compression. However, techniques described herein are not dependent on any particular compression mechanism. In block 430, the compressed block of data may be written to a subset of memory devices that comprise the line. The unwritten portions of the line are not used to store valid data. By writing the compressed block of data to a subset of memory devices, the total amount of write energy is reduced. Furthermore, by ensuring that the unwritten portions of the line are not used, there is no reason for the OS to be made aware of the compression. As far as the OS is concerned, each line stores one line sized block of data. The OS does not need to consider the possibility that a single line may hold data from two separate original blocks of data.

Figure 5A:
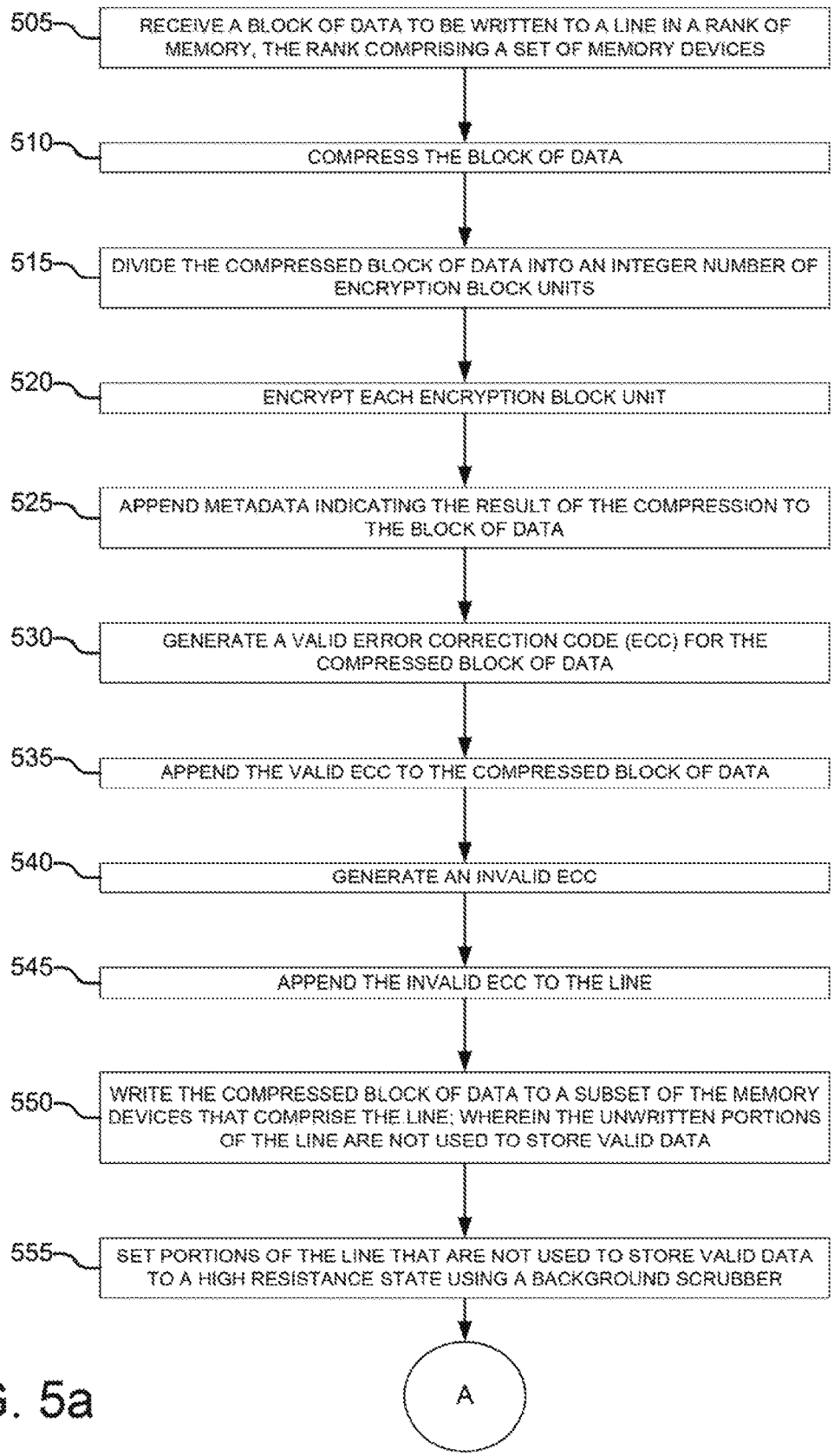
FIG. 5(a,b) depicts another example high level flow diagram of the data writing techniques described herein.
Figure 5B:
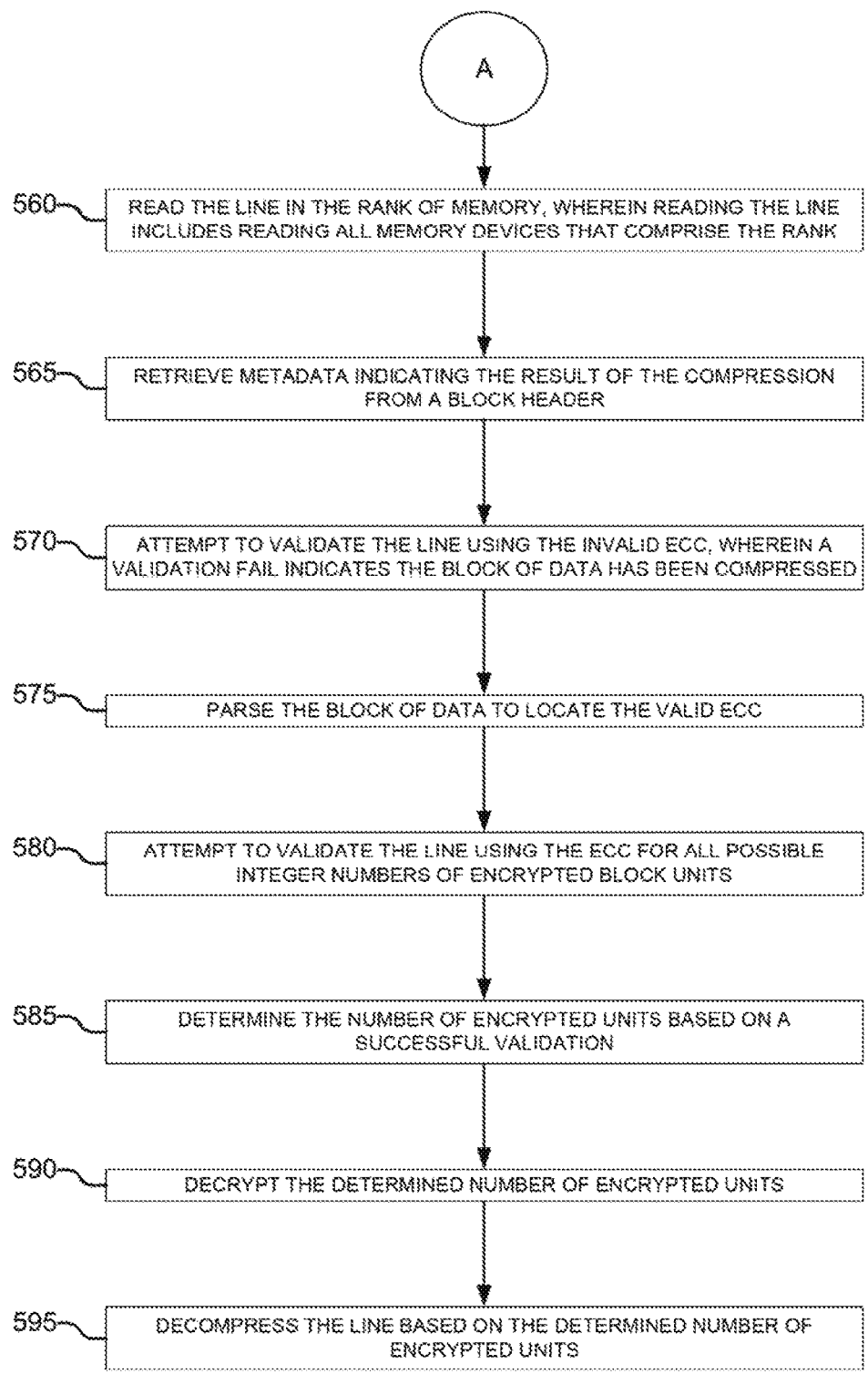

FIG. 5(a,b) depicts another example high level flow diagram of the data writing techniques described herein. In block 505, just as above in block 410, a block of data to be written may be received. In block 510, just as in block 420, the block of data may be compressed. In block 515, the compressed block of data may be divided into an integer number of encryption block units. As explained above, the encryption circuit may operate on a fixed size block. Thus, the compressed block may be divided in accordance with the fixed size block. As previously mentioned, blocks may be padded if necessary to arrive at the fixed encryption block size.

In block 520, each encryption block unit may be encrypted. The techniques described herein are not limited to any particular type of encryption. Any encryption mechanism is suitable for use with the techniques described herein. In block 525, metadata indicating the result of the compression may be appended to the block of data. This metadata may include the compression header or may include using spare bits within the ECC to indicate if the block is compressed. As explained above, the particular type of metadata used is dependent on if extra bits are available and if encryption is being used.

In block 530, a valid ECC may be generated for the compressed block of data. As mentioned above, the valid ECC may be used to verify a compressed line. In block 535, the valid ECC may be appended to the compressed block of data. In block 540, an invalid ECC may be generated. In block 545, the invalid ECC may be appended to the line. As mentioned above, if the ECC validation of the line fails, this may indicate that the line has been compressed.

In block 550, the compressed block of data may be written to a subset of the memory devices that comprise the line. The unwritten portions of the line may not be used to store valid data. In block 555, portions of the line that are not used to store valid data may be set to a high resistance state using a background scrubber. As described above, setting unused portions of a line to a high resistance state may reduce the amount or energy used during a read or write of the memory devices.

In block 560, a line in a rank of memory may be read. Reading the line may include reading all memory devices that comprise the rank. In other words, all memory devices, even those which may not be storing valid data for the line are read. In block 565, metadata indicating the result of the compression may be retrieved from a block header. As mentioned above, in the case of an unencrypted line, the compression header is readily available.

In block 570, an attempt to validate the line using the invalid ECC may be made. A validation fail may indicate that the block of data has been compressed. In block 575, the block of data may be parsed to locate the valid ECC. As mentioned above, the validation failure with the invalid ECC may indicate a compressed block. The location of the valid ECC may be determined by parsing the compression header to determine where the valid ECC is and how the block was compressed.

In block 580, the line may be validated using the ECC for all possible integer numbers of encrypted units. As described above, in the case of an encrypted line, there may be a limited number of possible encrypted blocks (e.g. 1, 2, 3, or 4). The validation attempts may be made on each of these limited possibilities, and a successful validation may indicate how many encrypted blocks are present. It should be understood that the above description is based on the 16 byte per encryption unit granularity. In some implementations, the determining granularity is the compression granularity. For example, the ECC check could be performed assuming one device, two devices, and so on, up to the maximum number of devices. The ECC check that succeeds may determine how compressed the block is. In block 585 the number of encrypted units may be determined based on the successful validation.

In block 590, the determined number of encrypted units may be decrypted. As described above, by only decrypting the number of encrypted units present, the energy used for decryption may be reduced. In block 595, the line may be decompressed based on the determined number of encrypted units.

Figure 6:
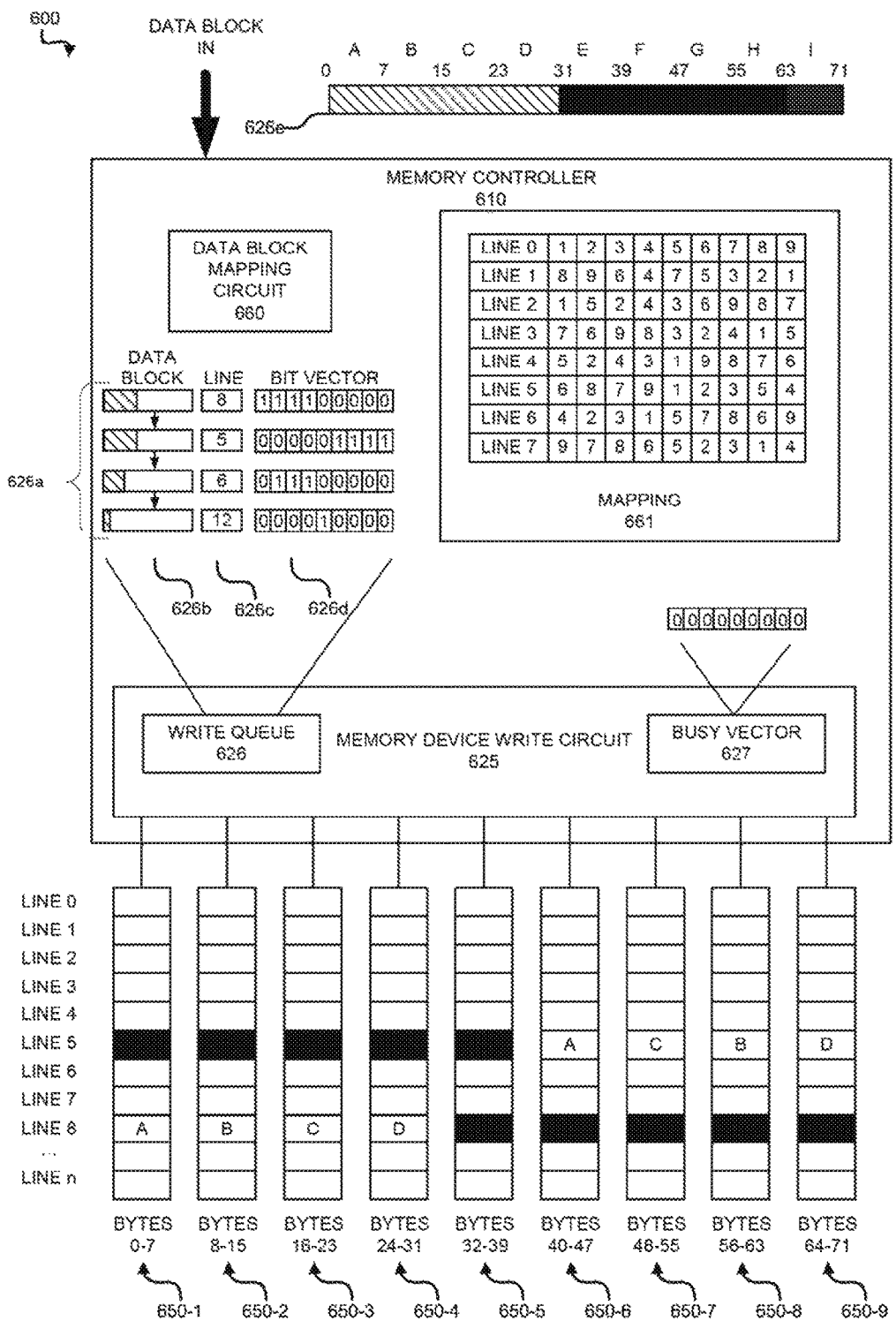
FIG. 6 depicts an example system including write based on mapping according to the techniques described herein.

FIG. 6 depicts an example system including write based on mapping according to the techniques described herein. System 600 may include all of the components previously described with respect to FIGS. 1 and 2, however those components are not shown for purposes of clarity. System 600 depicts mainly those components used for writes based on mapping. However, it should be understood that system 600 contains all the functionality previously described.

System 600 may include a memory controller 610. The memory controller may include a data block mapping circuit 660, a memory device write circuit 625, and memory devices 650-1 . . . 9.

The data block mapping circuit 660 may include the functionality used to provide the write based on mapping techniques described herein. The data block mapping circuit may include a mapping 661. The mapping may determine how a data block is written to the various memory devices. In one example implementation, the mapping may be an array. Each line of the array may be considered the mapping to be used for that line. For example, as shown, the mapping for lines 0 through 7 is shown. In some example implementations, the mapping may be selected to minimize the memory device overlap of any two adjacent lines. For this purpose, the first and last line may be considered adjacent. Minimizing the overlap may be helpful in increasing the probability that multiple lines may be written in parallel, as will be described below.

A mapping may be selected based on the line being written. For example, the line number being written may be divided (mod) by the total lines shown in the mapping (e.g. 8). The remainder may determine the selected mapping. For example, if line 8 is being written, the remainder will be 0, thus the mapping for line 0 is selected. Likewise, if line 13 is being written, the remainder will be 5, then the mapping for line 5 may be selected.

Once a mapping for the line is selected, the memory devices used for that line can be determined. As shown, the 9 boxes to the right of each line indicate the memory devices that are to be used to write that line, as well as the order in which those memory devices are to be written. It should be noted that order does not imply sequential writes of memory devices. In fact, the devices may be written in parallel. For purposes of this description the write order indicates how bytes of the line are mapped to the memory devices (e.g. first 8 bytes on device x, second 8 bytes on device y, etc.). Thus, when writing a line, the particular memory device used may be dependent both on the line being written as well as the size of that line. Operation of the mapping is described in further detail with respect to an example below.

The memory device write circuit 625 includes all of the functionality of the memory device write circuit described above. In addition, the circuit may include a write queue 626 and a busy vector 627. The write queue may be a queue that holds lines that are waiting to be written to the memory devices. An example portion of a write queue 626a is shown. Each entry in the write queue may include the data block (e.g. the compressed block) 626b, the line number to be written 626c, and a bit vector 626d. As will be explained in further detail below, the bit vector may be used to indicate which memory devices will be used to write a particular block of data as well as being used to determine which writes may occur in parallel.

The circuit 625 may also include a busy vector 627. The busy vector may indicate which memory devices, or more specifically the communications channel to the memory devices that are currently involved in a write transaction. For example, the busy vector may have one bit that represents each memory device. A set bit may indicate the memory device (e.g. the communications channel to the memory device) is currently busy, while a clear bit may indicate the device is currently not busy. As will be explained below, the busy vector may be used to determine when writes may proceed concurrently.

The system 600 may also include memory devices 650-1 . . . 9. These memory devices are generally the same as those depicted in FIGS. 1 and 2, although more lines are shown.

In operation, data blocks may be received by the memory controller. Just as above, those data blocks may be compressed. The compressed data blocks may then be placed in write queue 626. As shown, the data blocks 626b contain a hashed portion, which indicates data to be written and a clear portion, which may indicate data that need not be written (e.g. unused space resulting from the compression). Line 626e shows a line in more detail. For example, as shown, bytes 0-31 may include valid data to be written, while bytes 24-71, shown in black, may not need to be written.

In the example implementation shown in FIG. 6, each memory device may store 8 bytes of a line. As such, the line 626e is divided into 8 byte segments, labeled A-I. These labels will now be used to describe how the mapping may be used to write a line to the memory devices in memory.

For example, assume that the line 626e is to be written to line 8. As explained above, the line number (i.e. line memory address) may be divided (mod) by the number of entries in the mapping table (e.g. 8) and the remainder used to determine which line in the mapping to select. In this case, line 8 divided by 8 has a remainder of zero, and as such the line 0 mapping may be selected. Referring to the line 0 mapping, it is shown that the memory devices are used in order (e.g. 1-9). In this example, the line 626e contains valid data to be written for bytes 0-31, corresponding to labels A-D. Thus, the first memory device may be used to write bytes 0-7 (e.g. A), the second device used to write byte 8-15 (e.g. B), the third device used to write bytes 16-23 (e.g. C) and the fourth device used to write bytes 24-31 (e.g. D).

As shown in the write queue, the memory devices that would be used for the write are shown in the bit vector 626d. As shown, the first 4 bits are set, indicating the first four devices will be used. As shown in line 8 in the memory devices, the blocks A-D are written to the first four memory devices in order. The process of writing the blocks is described in further detail with respect to FIG. 7.

As another example, assume line 626e is to be written to line 5 (or to a line which results in a remainder of 5). As such, the line 5 mapping will be used. The mapping shown for line 5 indicates that block A goes on device 6, block B on device 8, block c on device 7, and block D on device 9. Just as above, the busy vector is set to indicate that memory devices 6-9 are used for the write. It should be noted that the memory devices used for writing the same data block 626e are different, depending on which line in the memory device is being used. In addition to the lines described above, two additional lines (e.g. 6 and 12) are shown. As shown, these lines will use memory devices indicated by their bit vectors. The use of the bit vectors and the busy vector 627 is described in further detail with respect to FIG. 7.

FIGS. 7(*a-d*) depict examples of using bit vectors and a busy vector to permit concurrent writes according to techniques described herein. As described above, the bit vector may indicate for each entry in the write queue which memory devices (e.g. the communications channels for those memory devices) are going to be used to perform that write. If two different writes will use completely different memory devices, with no overlap, the two (or more) writes may proceed in parallel, because the communications channels to those devices would also contain no overlap. This is because although a memory device may not write two independent lines (e.g. portions of the line stored on that device) simultaneously, there is no need for independent memory devices to all write the same line. Thus, if one memory device is writing line 0, a different memory device could write line 5, because each device would be receiving commands over a different communication channel.

Figure 7A:
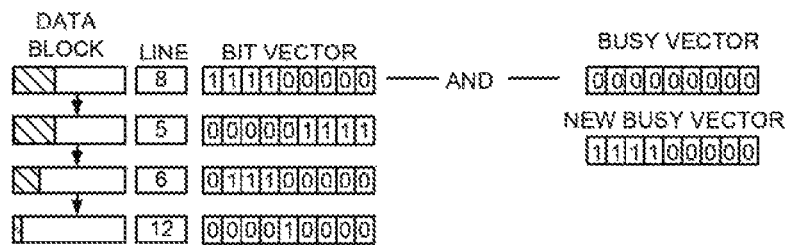
FIGS. 7(a-d) depict examples of using bit vectors and a busy vector to permit concurrent writes according to techniques described herein.

FIG. 7*a* depicts a write queue containing several lines to be written to the memory devices. The write queue is similar to that described with respect to FIG. 6. For purposes of this description, assume that at the outset, no writes are currently in progress (e.g. busy vector is completely clear). As shown in FIG. 7*a*, the first line in the write queue has the bit vector marked to indicate memory devices 1-4 are to be used. The system may first perform a bitwise AND with the busy vector. If the result is a zero, that means that the bit vector and the busy vector have no common bits set. What this means is that the memory devices used in the busy vector are not the same as those that will be used according to the busy vector.

In the present example, the busy vector is initially empty. As such, the AND operation produces a zero result, indicating that the write may proceed. To update the busy vector to indicate which memory devices are in use, a bitwise OR operation may be performed between the busy vector and the bit vector. The result may then be stored in the busy vector. The end result being that the bits in the busy vector that were previously set, remain set, and those memory devices that will become busy with the new write will now have the corresponding bits set.

Figure 7B:
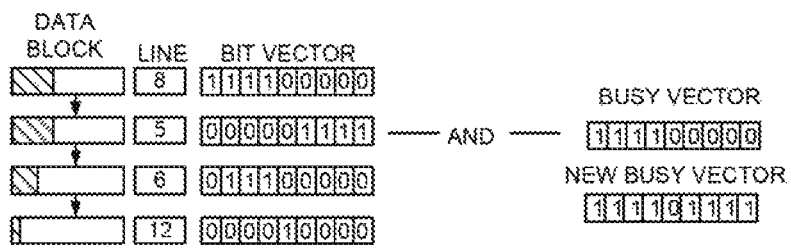

FIG. 7*b* depicts an attempt to write the second data block in the write queue. As shown, the bit vector for the second item in the write queue indicates that the last four memory devices (e.g. 6-9) are to be used for the write. Again, a bitwise AND between the bit vector and the busy vector is performed. Because there is no overlap of busy devices, the resultant value is zero, indicating that the two writes may proceed concurrently. The busy vector may then be updated by performing a bitwise OR between the current busy vector and the bit vector of the newly added write.

Figure 7C:
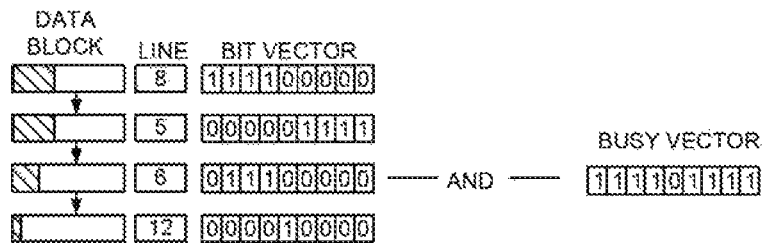

FIG. 7*c* depicts an attempt to write the third data block in the write queue. As shown, the bit vector for the third items indicates that three memory devices (e.g. 2-4) are to be used for the write. However, a bitwise AND of the bit vector with the busy vector results in a non-zero value (e.g. 011100000 AND 111101111=011100000). Because the same memory devices would be needed for both writes, the write of line 6 cannot occur concurrently. As such, the item remains in the write queue, and the next element is checked.

Figure 7D:
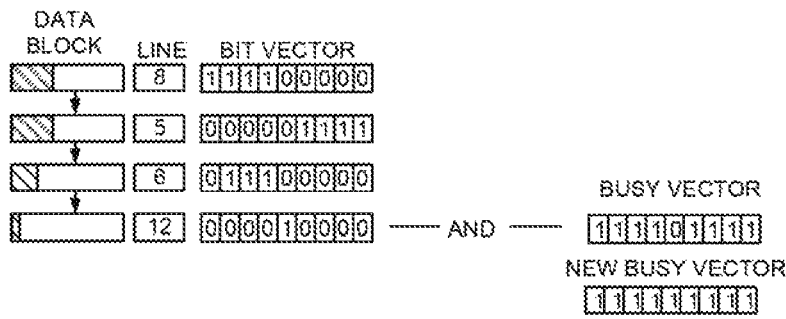

FIG. 7*d* depicts an attempt to write the fourth data block in the write queue. As shown, the fourth data block may use 1 memory device (e.g. device 5). Performing a bitwise AND between the bit vector and the busy vector results in a zero value. As mentioned above, a zero value indicates the writes may proceed concurrently. The busy vector may be updated by performing a bitwise OR. It should be noted that all bits in the busy vector are now set, indicating the communications channel to all memory devices are currently busy with a write. Thus, no new write of a line may be added, as all memory devices (e.g. the communications channel to each device) are busy. When the write issues, the bits associated with the memory devices may be cleared. At that point, new writes may proceed.

Although not shown in the figures described herein, it should be understood that when reading a line from the memory devices, the mapping described above is first reversed to put the line back into the original order. Then, the processing described with respect to FIGS. 1-5 may occur. In the context of the present example system, when a line is read, all nine devices may be read. Then it may be determined which mapping was used based on the address of the line. The mapping may then be reversed to recover the original line. The steps of determining the encryption/compression may then proceed as described above.

Figure 8:
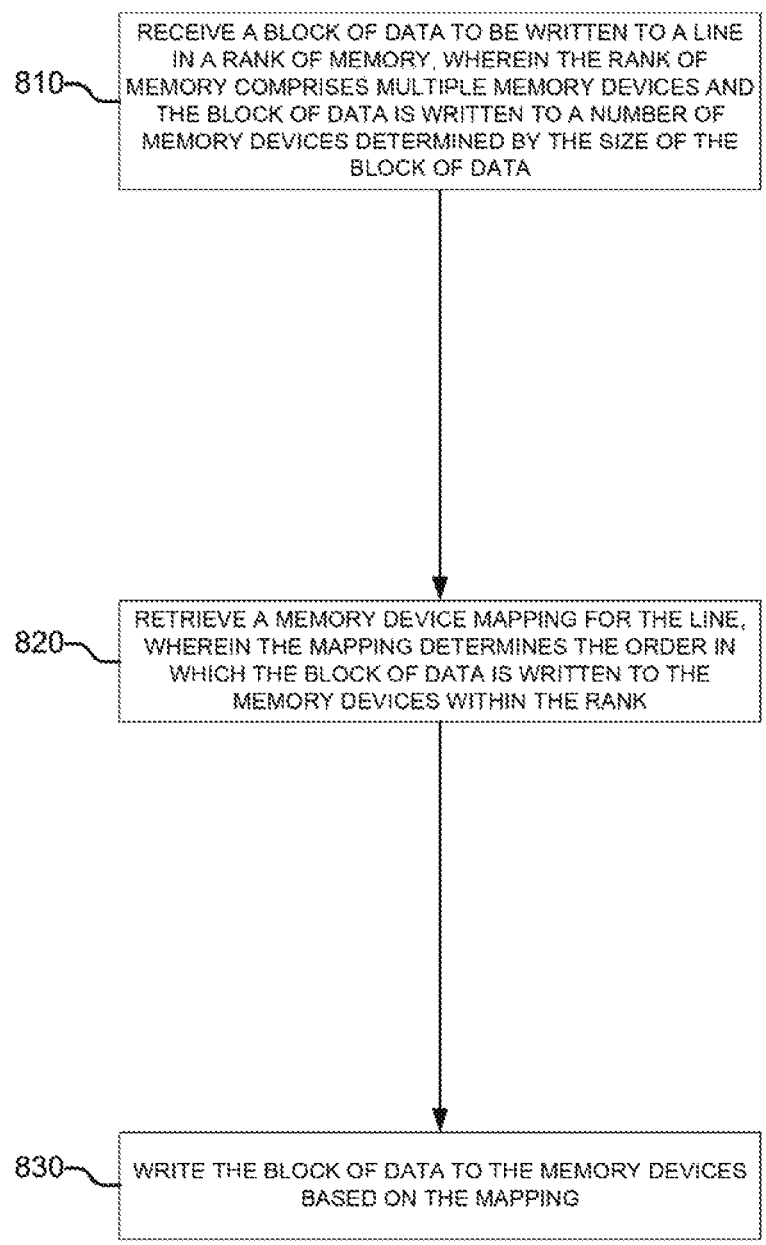
FIG. 8 is an example high level flow diagram for writing data according to a mapping according to techniques described herein.

FIG. 8 is an example high level flow diagram for writing data according to a mapping according to techniques described herein. In block 810, a block of data to be written to a line in a rank of memory may be received. The rank of memory may comprise multiple memory devices and the block of data may be written to a number of the memory devices determined by the size of the block of data. In other words, a block of data to be written to the memory devices may be received. The number of memory devices needed in order to write the complete block of data is determined by the size of the block of data. Smaller blocks may require fewer memory devices, while larger blocks may require more memory devices.

In block 820, a memory device mapping for the line may be retrieved. The memory device mapping may determine the order in which the block of data is written to the memory devices within the rank. In other words, the memory device mapping determines which memory devices will be used to write a block of data to the memory devices. In addition, the mapping determines the order in which the data block is written. As described above, the block of data is not necessarily written to memory devices in sequential order. Instead, the mapping may control the order of writes. In block 830, the block of data may be written to the memory devices. The write of the block of data to the memory devices may be based on the mapping.

Figure 9:
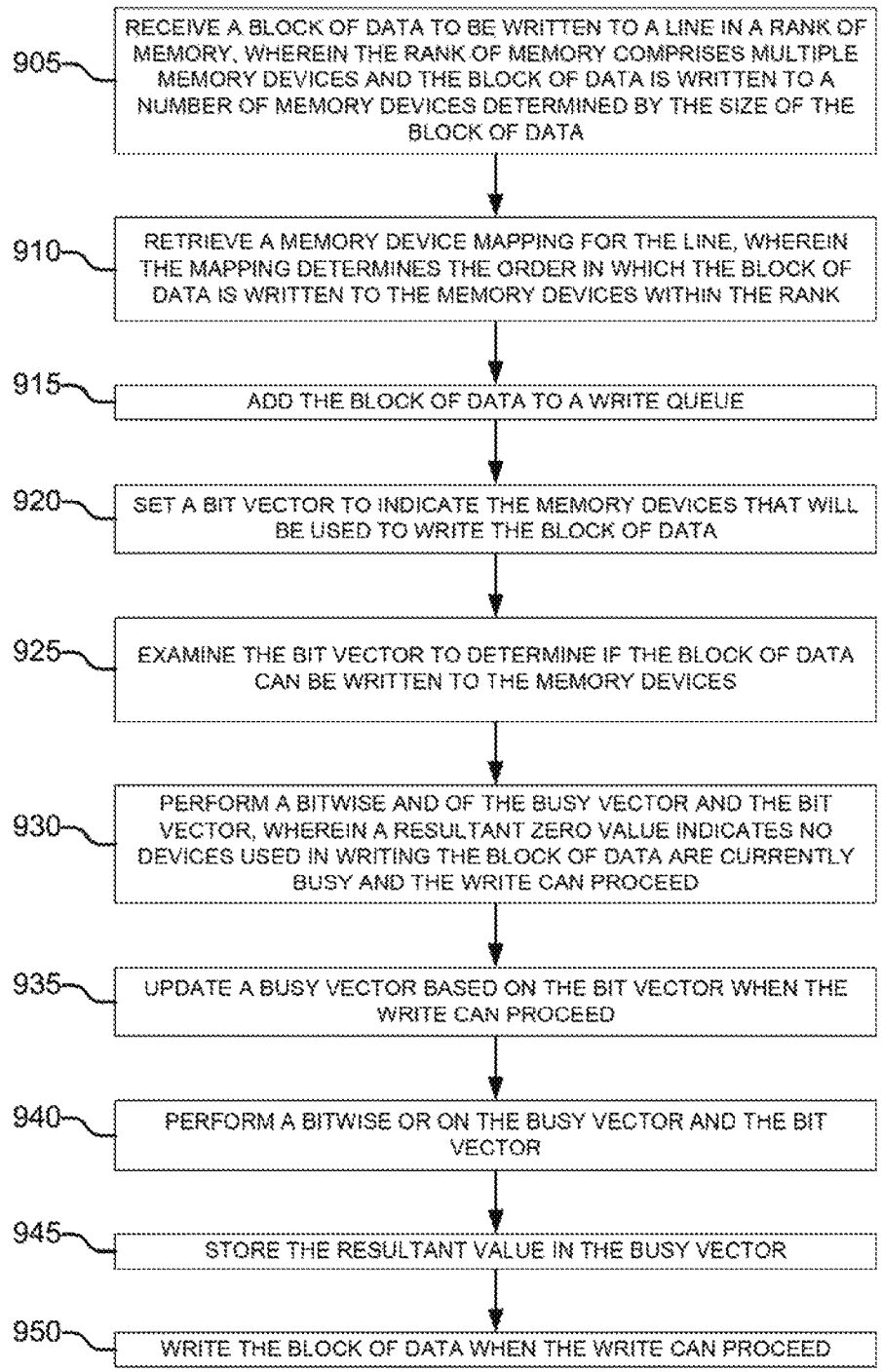
FIG. 9 is another example high level flow diagram for writing data according to a mapping according to techniques described herein.

FIG. 9 is another example high level flow diagram for writing data according to a mapping according to techniques described herein. In block 905, just as in block 810, a block of data to be written to a line in a rank of memory may be received. The number of memory devices needed to write the line varies based on the size of the block of data. In block 910, just as in block 820, a memory device mapping may be retrieved. The mapping may determine which devices, and in which order, the block of data is written to the memory devices.

In block 915, the block of data may be written to a write queue. The write queue may hold blocks of data that are waiting to be written to a line in a rank of memory devices. The write queue may hold the data blocks until the memory device write circuit is ready to write the line. In block 920, a bit vector may be set to indicate the memory devices that will be used to write the block of data. As mentioned above, the techniques described herein allow for fewer than the total number of memory devices to be used when writing a line of data to the memory devices. The bit vector may be used to identify which memory devices will be used when writing a specific block of data.

In block 925, the bit vector may be examined to determine if the block of data can be written to the memory devices. For example, if none of the memory devices that are specified in the bit vector are currently being written to, the write may proceed. Block 930 describes a technique to determine if the write can proceed. In block 930 a bitwise AND of the busy vector and the bit vector may be performed. A resultant zero value may indicate that no devices used in writing the block of data are currently busy, and the write can proceed. In other words, the busy vector maintains a record of which memory devices are currently involved in a write operation. The record is maintained as a busy bit vector. A bitwise AND of the bit vector and busy vector can only be zero when there is no overlap of set bits in each of those two vectors. No overlap indicates that the set of memory devices for each vector are different.

In block 935, the busy vector may be updated based on the bit vector when the write can proceed. If it is determined that a write can proceed, the busy vector is updated to reflect the memory devices that will be used for the write. These memory devices would then be considered busy for later comparison. Block 940 describes a mechanism for updating the busy vector. In block 940, a bitwise OR may be performed on the busy vector and the bit vector. In other words, the current busy vector is bitwise OR'ed with the bit vector of the line to be written. In block 945, the resultant values may be stored in the busy vector. The resultant value may be stored as the new busy vector. The bitwise OR operation ensures that the bits will be set for each memory device currently in use, or will be in use when the new block of data is written. Thus the new busy vector is set to indicate all memory devices that would be in use.

In block 950, the block of data may be written when the write can proceed. If the comparisons above indicate that there is no conflict between a new write and any write currently in progress, the new write may proceed. As mentioned above, bandwidth may be increased as multiple writes may occur in parallel.

We claim:

1. A method comprising:
    receiving a block of data to be written to a line in a rank of memory, wherein the rank of memory comprises multiple memory devices and the block of data is written to a number of memory devices determined by the size of the block of data;
    retrieving a memory device mapping for the line, wherein the mapping determines the order in which the block of data is written to the memory devices within the rank;
    writing the block of data to the memory devices based on the mapping, wherein writing the block of data to the memory devices further comprises adding the block of data to a write queue and setting a bit vector to indicate memory devices that will be used to write the block of data;
    examining a bit vector to determine if the block of data can be written to the memory devices;
    updating a busy vector based on the bit vector when the write can proceed; and
    writing the block of data when the write can proceed.

2. The method of claim 1 wherein examining the bit vector to determine if the variable sized block of data can be written to the memory devices further comprises:
    performing a bitwise AND of the busy vector and the bit vector, wherein a resultant zero value indicates no devices used in writing the block of data are currently busy and the write can proceed.

3. The method of claim 2 wherein updating the busy vector comprises:
    performing a bitwise OR on the busy vector and the bit vector; and
    storing the resultant value in the busy vector.

4. The method of claim 3 wherein the busy vector and bit vector indicate the communications channel to the memory device is busy.

5. The method of claim 1, wherein the mapping comprises:

| line 0: | 1 | 2 | 3 | 4 | 5 | 6 | 7 | 8 | 9; |
|---|---|---|---|---|---|---|---|---|---|
| line 1: | 8 | 9 | 6 | 4 | 7 | 5 | 3 | 2 | 1; |
| line 2: | 1 | 5 | 2 | 4 | 3 | 6 | 9 | 8 | 7; |
| line 3: | 7 | 6 | 9 | 8 | 3 | 2 | 4 | 1 | 5; |
| line 4: | 5 | 2 | 4 | 3 | 1 | 9 | 8 | 7 | 6; |
| line 5: | 6 | 8 | 7 | 9 | 1 | 1 | 3 | 5 | 4; |
| line 6: | 4 | 2 | 3 | 1 | 5 | 7 | 8 | 6 | 9; and |
| line 7: | 9 | 7 | 8 | 6 | 5 | 2 | 3 | 1 | 4. |

6. The method of claim 5 wherein the mapping minimizes the memory device overlap of any two adjacent lines.

7. The method of claim 1 further comprising:
    reading the memory devices that comprise a rank;
    determining the mapping used for a line to be read; and
    reordering data read from each of the memory devices based on the mapping.

8. A device comprising:
    a data block mapping circuit to map a compressed block of data to memory devices in a rank of memory; and
    a write circuit to write the block of data to the memory devices in the order determined by the mapping circuit, wherein writing the block of data to the memory devices further comprises adding the block of data to a write queue and setting a bit vector to indicate memory devices that will be used to write the block of data;
    examining a bit vector to determine if the block of data can be written to the memory devices;
    updating a busy vector based on the bit vector when the write can proceed; and
    writing the block of data when the write can proceed.

9. The device of claim 8 wherein the write circuit further:
    determines memory devices currently busy with a write operation; and
    allows an additional write operation when the additional write operation does not involve any of the currently busy memory devices.

10. The device of claim 8 wherein determining that the memory device is busy includes determining the communications channel to the memory device is busy.

11. A system comprising:
    A rank of memory, the rank of memory comprising a plurality of memory devices; and
    a memory controller, the memory controller to write a line of data to the memory devices in an order based on a mapping,
    wherein writing the line of data to the memory devices further comprises adding the line of data to a write queue and setting a bit vector to indicate memory devices that will be used to write the line of data;
    examining the bit vector to determine if the line of data can be written to the memory devices;
    updating a busy vector based on the bit vector when the write can proceed; and
    writing the line of data when the write can proceed.

12. The system of claim 11 wherein the memory controller further:
    determines when the line of data can be concurrently performed with a write of a different line of data based on which memory devices are used in each write.

13. The system of claim 11 wherein determining when the line of data can be concurrently written includes determining if the communications channel for the memory device is busy.

* * * * *